US012463004B2

(12) United States Patent
Ishizawa et al.

(10) Patent No.: US 12,463,004 B2
(45) Date of Patent: Nov. 4, 2025

(54) CHARGED PARTICLE MICROSCOPE AND STAGE

(71) Applicant: Hitachi High-Tech Corporation, Tokyo (JP)

(72) Inventors: Kazuki Ishizawa, Tokyo (JP); Kenichi Nishinaka, Tokyo (JP); Michiko Suzuki, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 337 days.

(21) Appl. No.: 18/265,733

(22) PCT Filed: Dec. 24, 2020

(86) PCT No.: PCT/JP2020/048445
§ 371 (c)(1),
(2) Date: Jun. 7, 2023

(87) PCT Pub. No.: WO2022/137427
PCT Pub. Date: Jun. 30, 2022

(65) Prior Publication Data
US 2024/0120169 A1 Apr. 11, 2024

(51) Int. Cl.
*H01J 37/20* (2006.01)
*H01J 37/26* (2006.01)

(52) U.S. Cl.
CPC ............ *H01J 37/20* (2013.01); *H01J 37/265* (2013.01); *H01J 2237/20285* (2013.01)

(58) Field of Classification Search
CPC . H01J 37/20; H01J 37/265; H01J 2237/20285
See application file for complete search history.

(56) References Cited

U.S. PATENT DOCUMENTS 8,633,456 B2 * 1/2014 Buijsse ................. H01J 37/265 250/311

FOREIGN PATENT DOCUMENTS

JP 63-139290 A 6/1988
JP 2000-311645 A 11/2000
(Continued)

OTHER PUBLICATIONS

International Search Report (PCT/ISA/210) issued in PCT Application No. PCT/JP2020/048445 dated Mar. 9, 2021 with English translation (five (5) pages).
(Continued)

*Primary Examiner* — Sean M Luck
(74) *Attorney, Agent, or Firm* — Crowell & Moring LLP

(57) ABSTRACT

A charged particle microscope includes an electron gun provided inside a barrel and a stage 20. In the stage 20, a sample holder 30 holding a sample SAM can be installed. The stage 20 includes an annular rough movement stage member 21*a* and an annular fine movement stage member 21*b*. An X rough movement actuator 22*a* and a Y rough movement actuator 23*a* are connected to the rough movement stage member 21*a*. An X fine movement actuator 22*b* and a Y fine movement actuator 23*b* are connected to the fine movement stage member 21*b*. Here, a first movable range in which the X rough movement actuator 22*a* and the Y rough movement actuator 23*a* are able to move the rough movement stage member 21*a* is broader than a second movable range in which the X fine movement actuator 22*b* and the Y fine movement actuator 23*b* are able to move the fine movement stage member 21*b*. Accordingly, it is possible to improve performance of the charged particle microscope.

15 Claims, 7 Drawing Sheets

(56) References Cited

FOREIGN PATENT DOCUMENTS

| | | | |
|---|---|---|---|
| JP | 2003-16984 | A | 1/2003 |
| JP | 2004-87141 | A | 3/2004 |
| JP | 2005-197338 | A | 7/2005 |
| JP | 2010-123354 | A | 6/2010 |
| JP | 2013-118170 | A | 6/2013 |

OTHER PUBLICATIONS

Japanese-language Written Opinion (PCT/ISA/237) issued in PCT Application No. PCT/JP2020/048445 dated Mar. 9, 2021 (three (3) pages).

* cited by examiner

[FIG. 1]
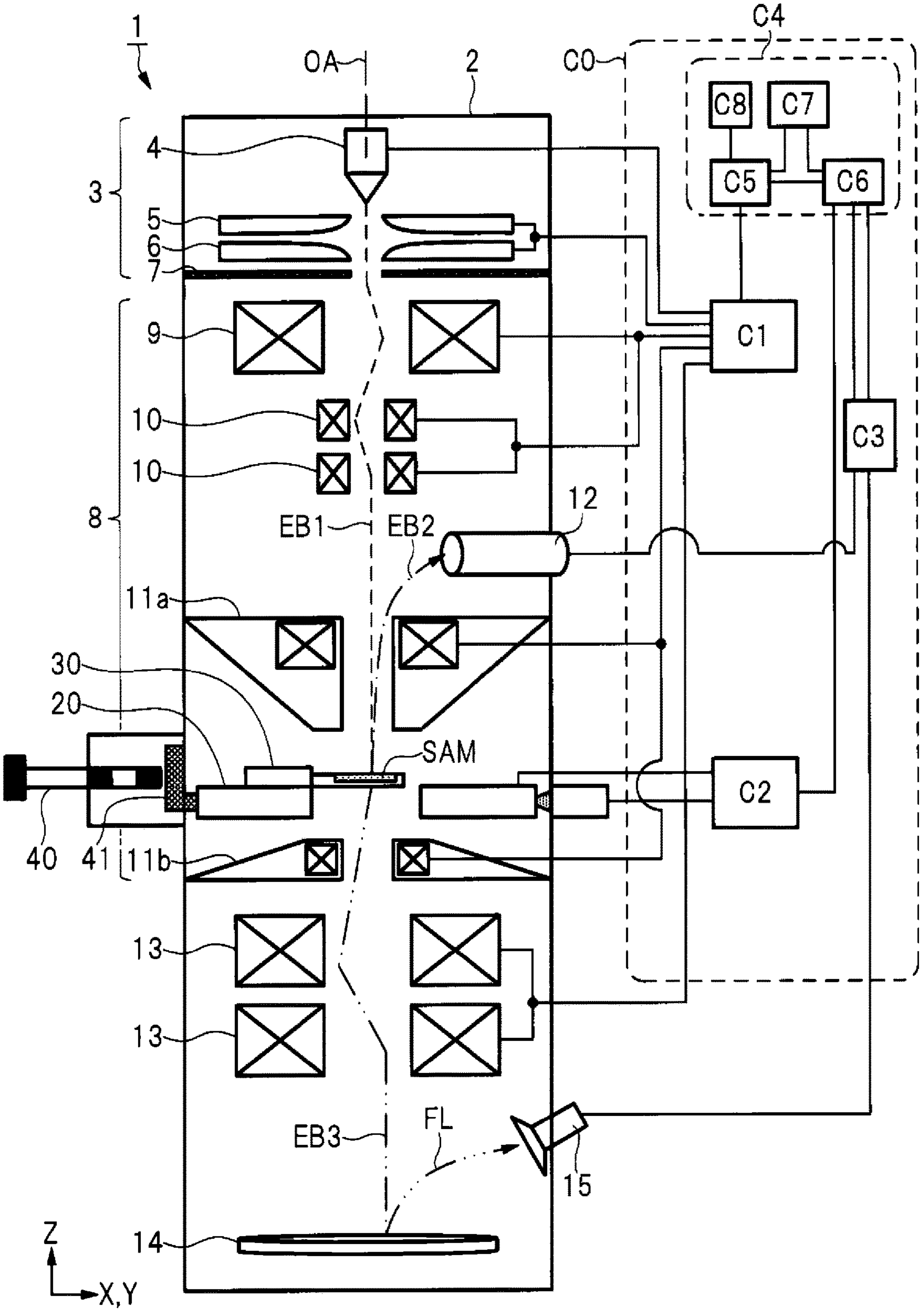

[FIG. 2]
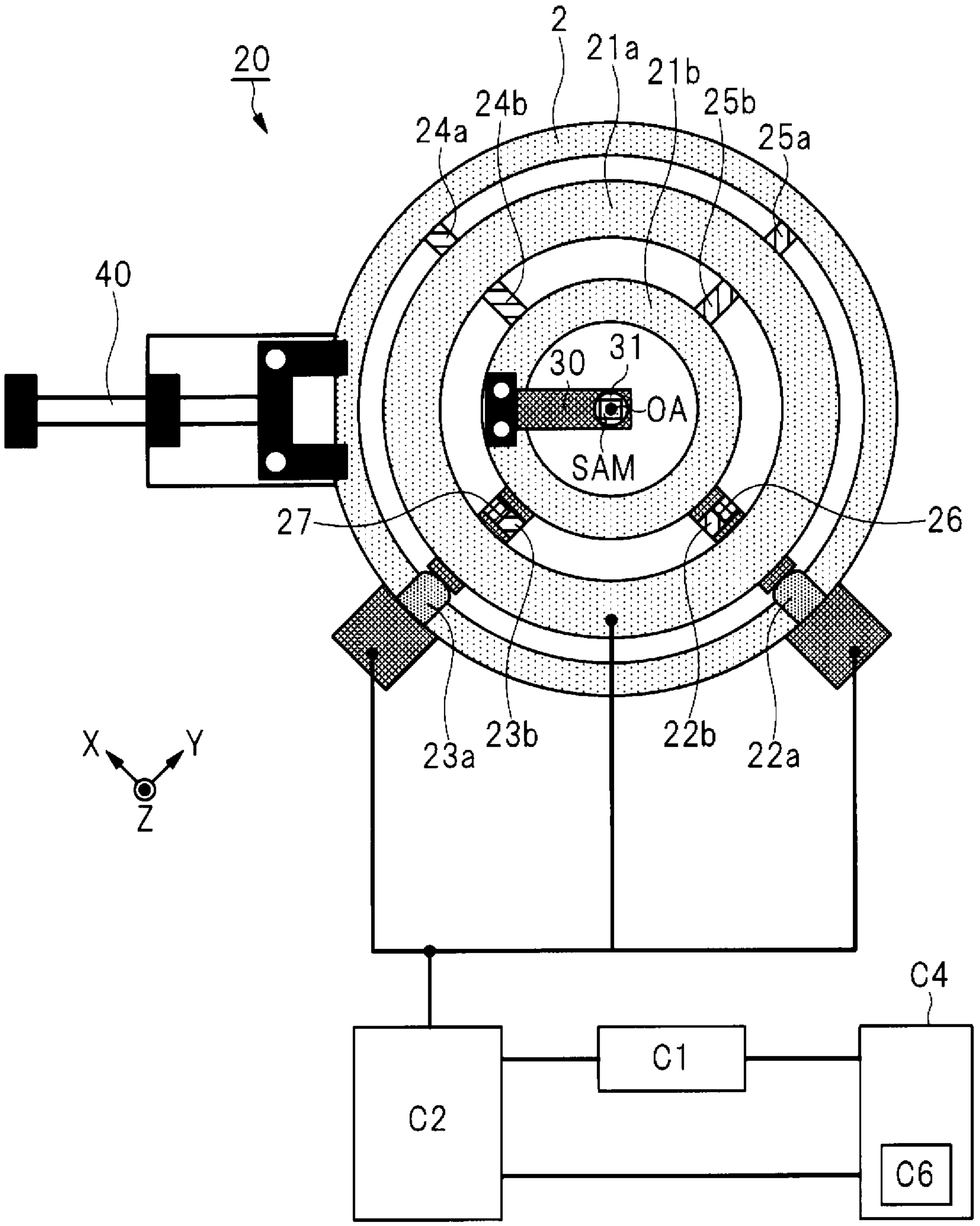

[FIG. 3]
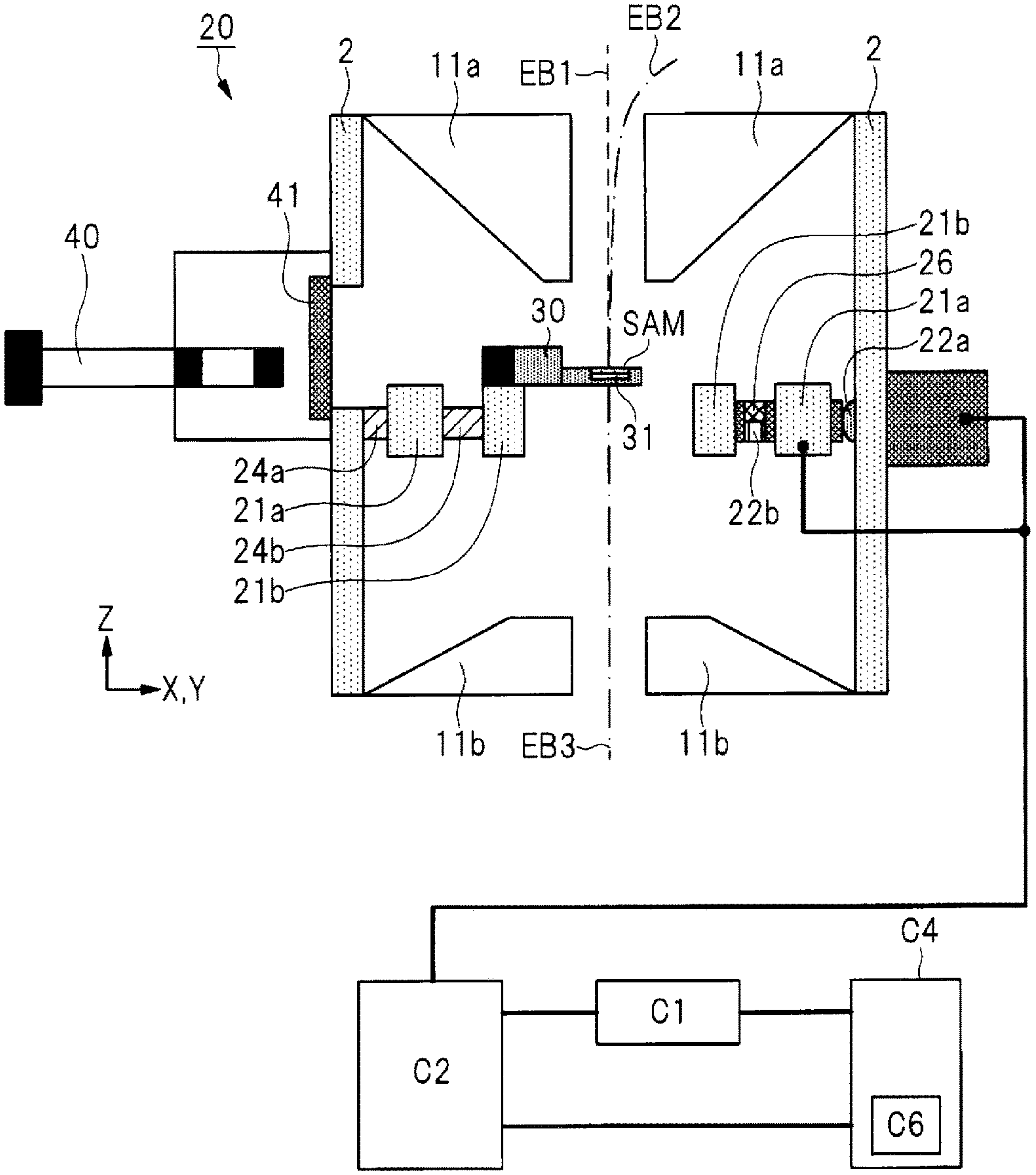

[FIG. 4]
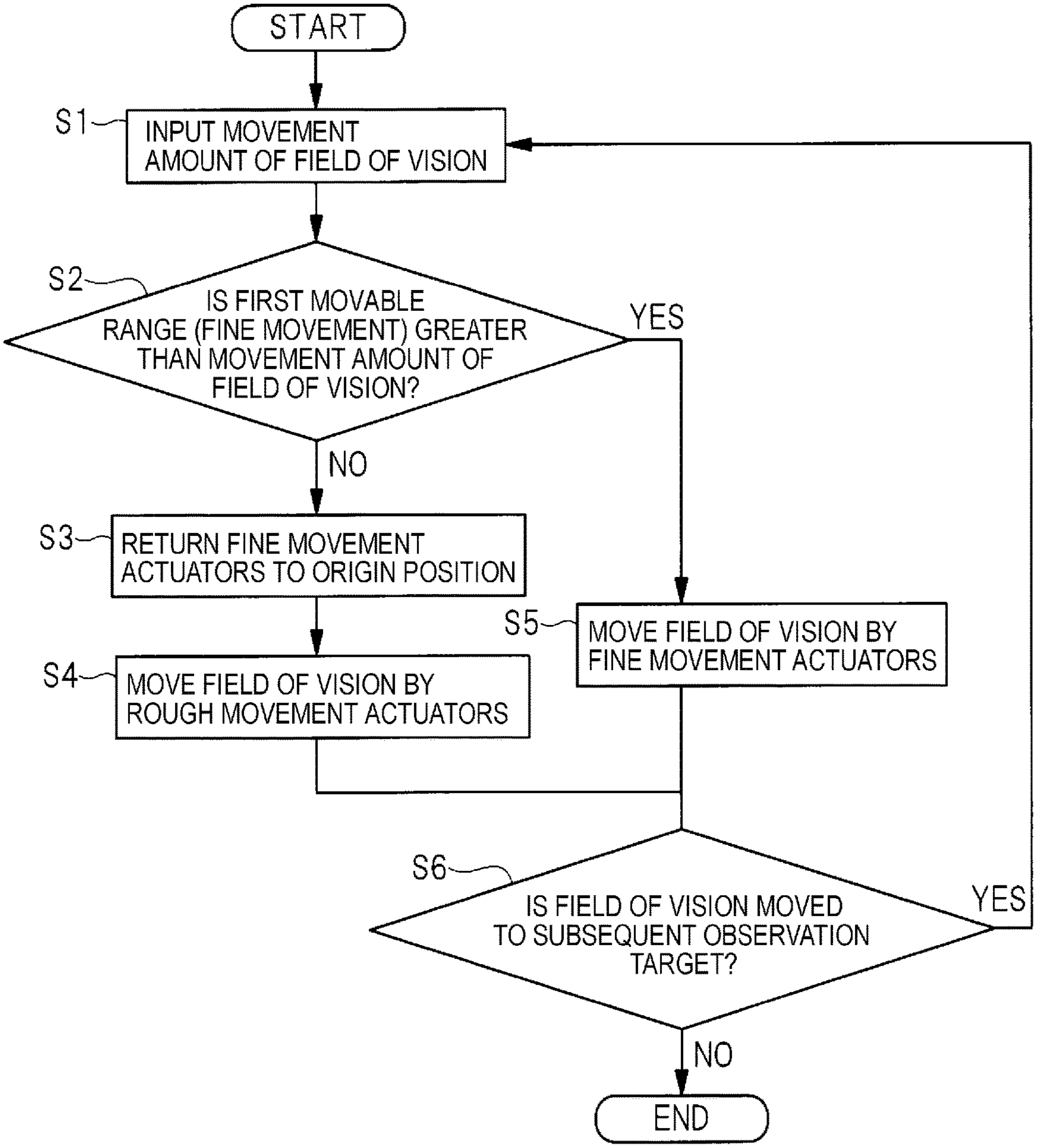

[FIG. 5]
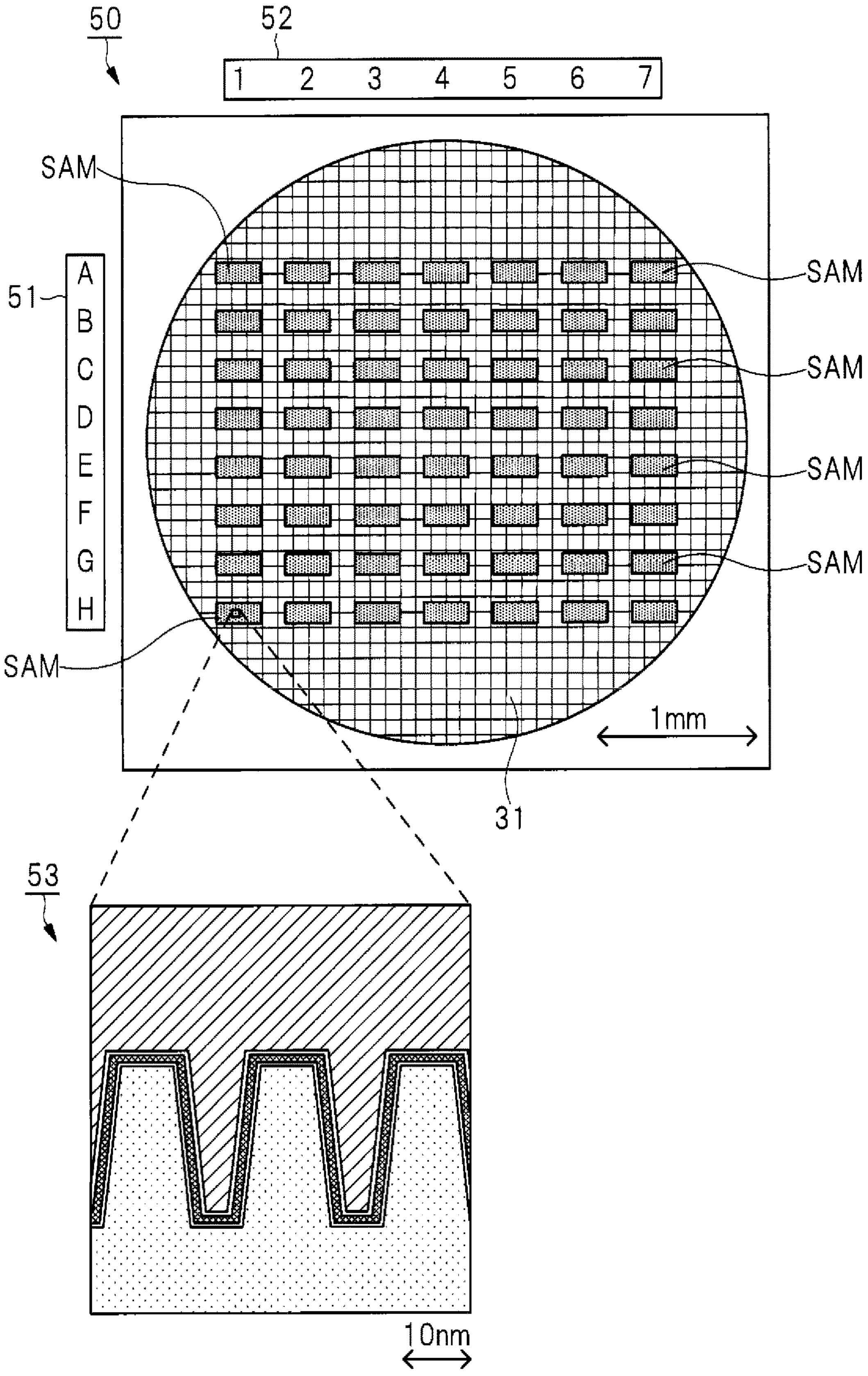

[FIG. 6]
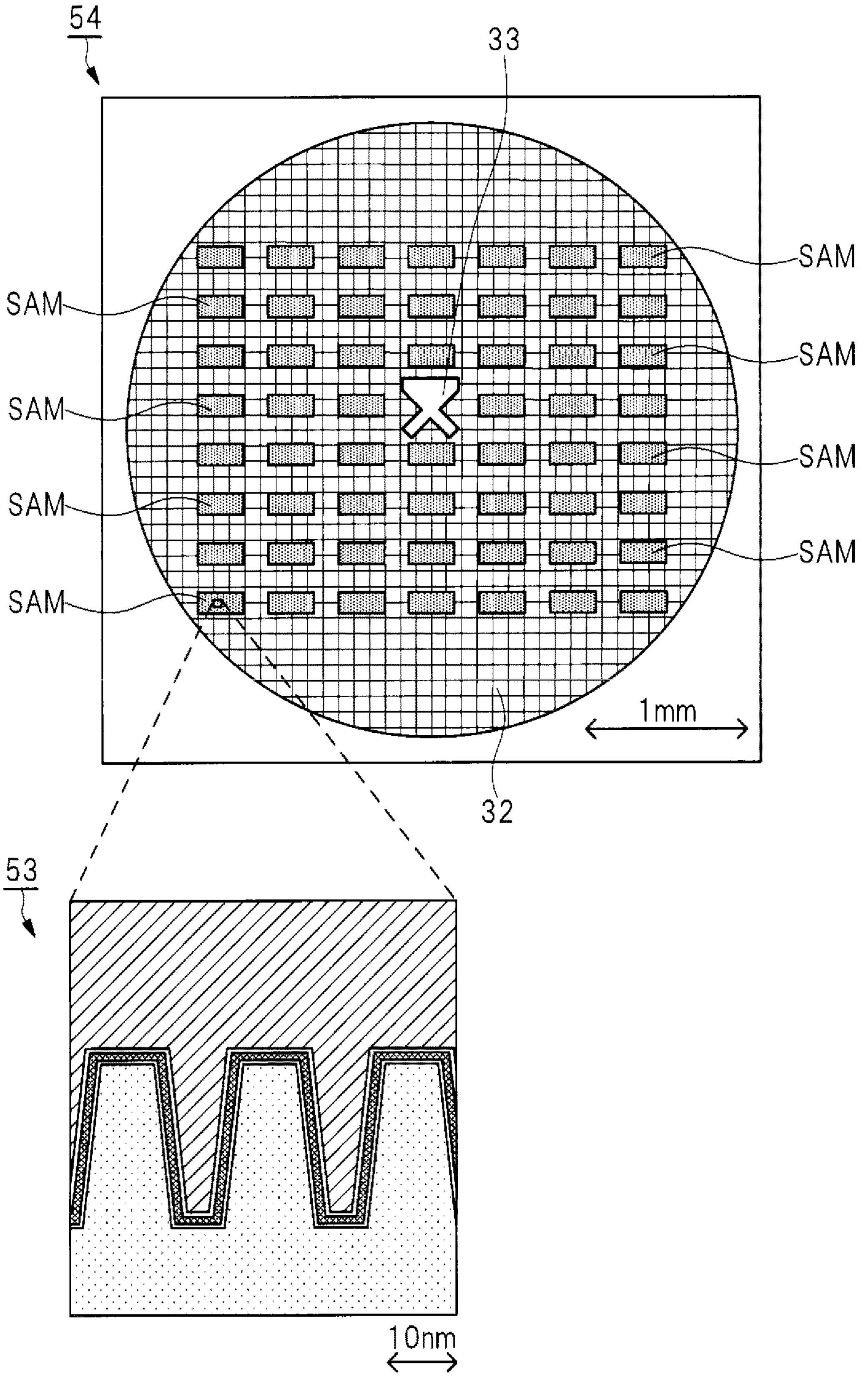

[FIG. 7]
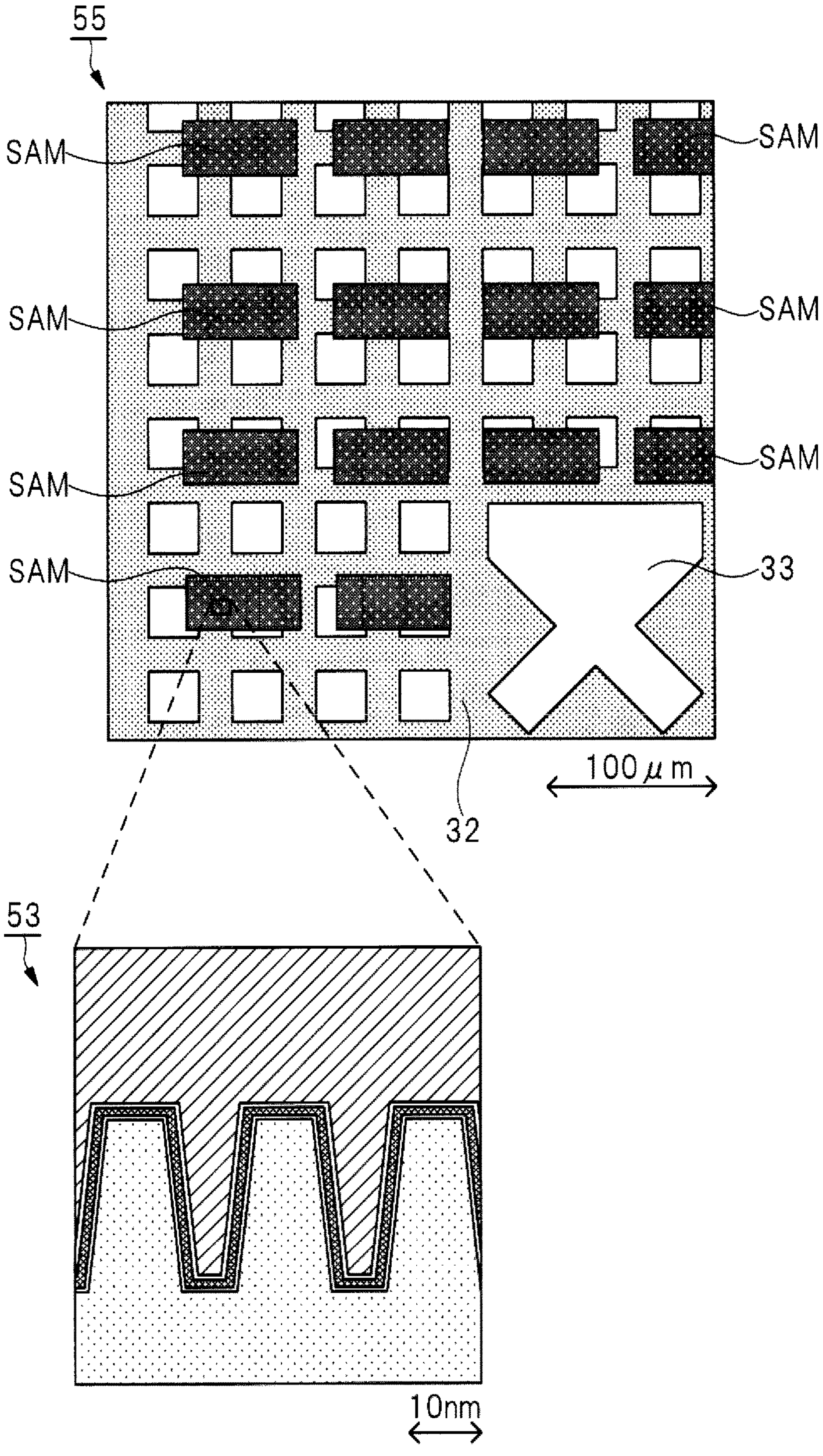

CHARGED PARTICLE MICROSCOPE AND STAGE

TECHNICAL FIELD

The present invention relates to a charged particle microscope and a stage, and more particularly, to a stage configured to install a sample holder and a charged particle microscope including the stage.

BACKGROUND ART

In recent years, semiconductor devices have been miniaturized. In particular, high integration and large capacities of semiconductor devices with 3-dimensional structures are dramatically advanced in combination with stacking technologies. As charged particle microscopes for analyzing such semiconductor devices, scanning electron microscopes (SEMs), transmission electron microscopes (TEMs), scanning transmission electron microscopes (STEMs), and the like are used. When the analyzing is performed with such devices, it is necessary to locate analysis target samples within top and bottom pole pieces (object lenses).

As one of methods of locating samples within pole pieces, for example, there is a top entry system. In the top entry system, a sample holder that holds a sample is inserted from the upper side (in the same direction as an optic axis) of the pole piece. Therefore, the sample holder can be fixed with relatively high rigidity.

Since a driving mechanism for the sample holder is installed under vacuum, the sample holder is rarely influenced by heat, a change in pressure, and sound waves. In addition, the shape of the sample holder is also symmetric with respect to an optic axis. Therefore, even when the sample holder is influenced by heat, the sample holder is stretched and contracted in a concentric circular shape with respect to an optic axis. Therefore, the sample holder is rarely influenced by image disturbance due to temperature drift.

However, in the top entry system, since it is necessary to locate the sample holder and the driving mechanism for the sample holder in a passage of an electron beam, it is necessary to enlarge a bore diameter of a top pole piece (an opening of the top pole piece), and thus a pole piece shape related to resolution performance is limited. Accordingly, there is a problem that the top entry system is not appropriate for high-resolution observation.

The top entry system has a structure in which the sample holder is contained inside the top pole piece, a signal such as secondary electrons, backscattered electrons, or characteristic X rays emitted from the sample is shielded, and thus it is difficult to acquire the signal. It is also difficult to handle an application such as heating, cooling, voltage applying, expansion, or contraction performed inside a charged particle microscope.

Accordingly, in recent years, a side entry system has been standardized. In the side entry system, a holder rod on which a sample holder is mounted is inserted between top and bottom pole pieces in the vertical direction with respect to an optic axis.

By using the side entry system, a mesh on which the sample holder and a sample are mounted can be directly disposed between the top and bottom pole pieces. Therefore, the sample can be introduced onto a passage of an electron beam without influencing a bore diameter of a pole piece related to resolution performance.

In the side entry system, there are few obstacles around the sample holder and the mesh. Therefore, it is relatively easy to acquire a signal such as secondary electrons, backscattered electrons, or characteristic X rays emitted from the sample. Since the sample holder and the holder rod are connected to each other, the holder rod is exposed to the outside of a barrel, it is easy to introduce and derive the signal through the holder rod. Further, it is relatively easy to handle an application such as heating, cooling, voltage applying, expansion, or contraction.

However, there is the following problem in the side entry system.

For example, since the holder rod connected to the sample holder is inserted into a barrel of a charged particle microscope, the holder rod has a vacuum side portion and an atmospheric pressure side portion. Accordingly, since the atmospheric pressure side portion is easily influenced by a change in pressure and sound waves, the holder rod is pushed and pulled due to the influence. Then, unintended movement of the sample may occur and positional deviation in a field of vision may occur.

The holder rod connected to the sample holder has a structure of a long rod shape in an insertion direction of the holder rod. Therefore, when a temperature of the sample holder and the holder rod is changed, thermal expansion or thermal contraction occurs in accordance with a linear expansion coefficient of such a material. Therefore, the unintended movement of the sample may occur and the positional deviation in the field of vision may occur.

Since a sample holder and a holder rod used in a standard side entry system have a mechanism for inserting the road into a barrel, the sample holder and the holder rod have a beam structure and are weak in vibration and image disturbance easily occurs.

PTL 1 discloses a technology for disposing a tip end of a sample holder of the side entry system on a cylindrical stage disposed inside a barrel as a structure that has high stability which is characteristic of the top entry system and easiness of handling of various applications which is characteristic of the side entry system.

In PTL 1, a cylindrical stage is disposed inside a barrel of an electron microscope and the stage is fixed to an inner wall of the barrel by using an X-axis pressing member and a Y-axis pressing member each configured by piezoelectric elements. Since the stage is moved by stretching and contracting the X-axis pressing member and the Y-axis pressing member, a position of the field of vision of a charged particle microscope can be moved.

In PTL 1, the sample holder is installed on the cylindrical stage provided inside the barrel by using a holding member mover. Thereafter, the holding member mover is detached from the sample holder. Therefore, since connection between the sample holder and an atmospheric pressure side structure is physically disconnected, the sample holder is rarely influenced by a change in pressure on an atmospheric pressure side, sound waves, or the like.

CITATION LIST

Patent Literature

PTL 1: JP2004-87141A

SUMMARY OF INVENTION

Technical Problem

In PTL 1, the X-axis pressing member and the Y-axis pressing member configured by the piezoelectric elements serve as a means for moving a position of a field of vision of an electron microscope, and thus the field of vision can be positioned with high accuracy of about 0.1 nm because of characteristics of the piezoelectric elements. However, a maximum movement range of the field of vision is limited to 1 to 100 μm. A mesh for locating a sample is configured generally with a diameter of about 3 mm and the maximum movement range of the field of vision is limited. Therefore, it is difficult to move the field of vision for taking a survey of the entire mesh.

Accordingly, it is conceivable that a cylindrical stage inside a barrel is moved by an actuator using a motor instead of the piezoelectric element. In this case, the maximum movement range of the field of vision can be set to about 1 to 5 mm, but a positioning resolution of the field of vision becomes about 1 to 10 nm. Therefore, it is difficult to move the field of vision with high accuracy.

When the field of vision is moved with the actuator using the motor, the field of vision can be moved minutely in a few of nm order by a means for moving the field of vision by bending an electron beam electromagnetically and changing an irradiation position of the electron beam. An image shift function is used for such a means. On the other hand, since this means is a means for moving an optic axis of the electron beam in principle, image quality such as image resolution or an irradiation amount of the electron beam may be influenced. Therefore, this means cannot be a preferable means.

The foregoing description can be summarized as follows.

As a first problem, in a top entry system, for example, deterioration in resolution due to enlargement of a bore diameter, difficulty in handling various applications, difficulty in handling image observation of secondary electrons and backscattered electrons, and difficulty in handling element analysis using an X ray can be exemplified.

As a second problem, in a side entry system, for example, drift of a position of a field of vision due to thermal expansion or thermal contraction, and image vibration and drift of the position of the field of vision at the time of a change in an atmospheric pressure can be exemplified.

As a third problem, as in PTL 1, narrowness of the maximum movement range of the field of vision when the piezoelectric elements are used in stage pressing members (the X-axis pressing member and the Y-axis pressing member) can be exemplified.

As a fourth problem, for example, shortage of resolution for highly accurate movement of a field of vision when a motor is used instead of the piezoelectric element in the system of PTL 1 can be exemplified.

As a fifth problem, for example, suppression of a change in a condition of the irradiation amount of the electron beam or the like and deterioration in image quality caused by the movement of the optic axis of the electron beam without using an image shift function can be exemplified.

The main objects of the present specification are to improve performance of the charged particle microscope and provide a stage for implementing the improvement in the performance, by solving each of the above problems. Other problems and novel features are apparent from description of the present specification and the appended drawings.

Solution to Problem

Representative embodiments disclosed in the present specification will be described simply below.

According to an embodiment, a charged particle microscope includes: a barrel; an electron gun provided inside the barrel and capable of emitting an electron beam; and a stage provided below the electron gun inside the barrel, fixed to the barrel, and configured to install a sample holder with a sample held. The stage includes a first stage member of which a planar shape is annular, a second stage member disposed to be concentric to the first stage member, a first actuator connected to the first stage member, and a second actuator connected to the second stage member. A first movable range in which the first actuator is able to move the first stage member is broader than a second movable range in which the second actuator is able to move the second stage member.

According to another embodiment, a stage for a charged particle microscope includes: a first stage member of which a planar shape is annular; a second stage member disposed to be concentric to the first stage member, a first actuator connected to the first stage member, and a second actuator connected to the second stage member. A first movable range in which the first actuator is able to move the first stage member is broader than a second movable range in which the second actuator is able to move the second stage member.

Advantageous Effects of Invention

According to an embodiment, it is possible to improve performance of a charged particle microscope and provide a stage for implementing the improvement in the performance.

BRIEF DESCRIPTION OF DRAWINGS

FIG. 1 is a schematic view illustrating an example of a charged particle microscope according to a first embodiment.

FIG. 2 is a plan view illustrating a stage according to the first embodiment.

FIG. 3 is a sectional view illustrating the stage according to the first embodiment.

FIG. 4 is a flowchart illustrating a field-of-vision movement means according to the first embodiment.

FIG. 5 is a schematic view illustrating a first field-of-vision movement means according to the first embodiment.

FIG. 6 is a schematic view illustrating a second field-of-vision movement means according to the first embodiment.

FIG. 7 is a schematic view illustrating the second field-of-vision movement means according to the first embodiment.

DESCRIPTION OF EMBODIMENTS

Hereinafter, embodiments will be described in detail with reference to the drawings. In all the drawings for describing the embodiments, the same reference numerals are given to members that have the same functions and repeated description thereof will be omitted. In the following embodiments, description of the same or similar portions will not be repeated in principle unless otherwise necessary.

X, Y, and Z directions described in the present specification intersect each other and are orthogonal to each other. In the present specification, the Z direction is assumed to be a vertical direction, a height direction, or a thickness direction of a certain structure. Expression of a "plan view", a "plan view", or the like used in the present specification means that a surface formed in the X and Y directions is viewed in the Z direction.

First Embodiment

<Structure of Charged Particle Microscope 1>

Hereinafter, a charged particle microscope 1 according to a first embodiment will be described with reference to FIG. 1. In the first embodiment, a transmission electron microscope (TEM) of a side entry system will be described as an example of the charged particle microscope 1.

The charged particle microscope 1 includes a barrel 2. An electron gun 3 capable of emitting an electron beam (a charged particle beam) EB1, an electron optical system 8, a detector 12, an imaging system 13, a fluorescent plate 14, a camera 15, and a stage 20 are mainly included inside the barrel 2. The inside of the barrel 2 can be kept in a vacuum state using a vacuum exhaust means (not illustrated).

The electron gun 3 includes an electron source 4 which is a source emitting the electron beam EB1, a suppression electrode 5, an extraction electrode 6, and a positive pole 7. The electron optical system 8 includes a condensing lens 9, a deflection lens 10, a top pole piece (a top object lens) 11*a*, and a bottom pole piece (a bottom object lens) 11*b*. The stage 20 is provided below the electron gun 3, is provided between the top pole piece 11*a* and the bottom pole piece 11*b*, and is fixed to the barrel 2. The imaging system 13 is configured by a projection lens or the like to form an image of a transmission electron EB3.

When a sample SAM is analyzed and observed, a sample holder 30 holding the sample SAM is conveyed by a sample conveyance device 40 from the outside to the inside of the charged particle microscope 1 through an operation of opening and closing a flange 41 provided in the barrel 2. The conveyed sample holder 30 is installed in the stage 20. Thereafter, the sample conveyance device 40 and the sample holder 30 are mechanically detached.

The electron beam EB1 emitted from the electron source 4 is extracted, converted, and accelerated by the suppression electrode 5, the extraction electrode 6, and the positive pole 7 to be emitted in a direction of an optic axis OA. The electron beam EB1 emitted from the electron gun 3 is expanded, contracted, and deflected by the condensing lens 9, the deflection lens 10, the top pole piece 11*a*, and the bottom pole piece 11*b*, an irradiation region is limited, and the sample SAM mounted on the sample holder 30 is irradiated with the electron beam EB1.

A signal electron EB2 is generated from the sample SAM irradiated with the electron beam EB1. The generated signal electron EB2 is detected by the detector 12. The signal electron EB2 is, for example, a secondary electron or a backscattered electron.

A part of the electron beam EB1 emitted to the sample SAM passes through the sample SAM as the transmission electron EB3. The transmission electron EB3 is contracted and expanded by the imaging system 13 to be emitted to the fluorescent plate 14. Fluorescence FL is generated from the fluorescent plate 14 irradiated with the transmission electron EB3. The generated fluorescence FL is detected by the camera 15.

Although not illustrated herein, another electron beam detector, an optical detector, an X-ray detector, an aberration corrector, a diaphragm mechanism related thereto, or the like is added to the charged particle microscope 1 in some cases.

The charged particle microscope 1 includes a general control unit C0. The general control unit C0 includes a main control unit C1, a stage control unit C2, a signal processing unit C3, and a computer control unit C4. The computer control unit C4 includes a CPU unit C5, an image processing unit C6, a storage unit C7, and a display unit C8. The general control unit C0 generally controls the control units C1 to C4. Therefore, in the present specification, the control performed by the control units C1 to C4 is performed by the general control unit C0 in some description. The general control unit C0 including the control units C1 to C4 is regarded as a single control unit. The general control unit C0 is simply referred to as a "control unit" in some cases.

The computer control unit C4 receives various instructions input by a user using an input device such as a mouse or a keyboard connected to the computer control unit C4. The CPU unit C5, the image processing unit C6, and the storage unit C7 are electrically connected to each other and the user can check each work performed by the computer control unit C4 on the display unit C8 connected to the CPU unit C5. The storage unit C7 can store various types of information such as image data and stage information. In addition to the instruction input by the user, the computer control unit C4 performs determination from image information, a selected recipe, or the like and automatically gives an instruction to each control unit in some cases.

The main control unit C1 is electrically connected to the CPU unit C5. The main control unit C1 is electrically connected to the electron source 4, the suppression electrode 5, the extraction electrode 6, the condensing lens 9, the deflection lens 10, the top pole piece 11*a*, the bottom pole piece 11*b*, and the imaging system 13 and controls operations of these based on instructions from the computer control unit C4.

The stage control unit C2 is electrically connected to the image processing unit C6. The stage control unit C2 is electrically connected to the stage 20 and controls an operation of the stage 20 based on an instruction from the computer control unit C4.

The signal processing unit C3 is electrically connected to the image processing unit C6, the detector 12, and the camera 15. The signal processing unit C3 can process the signal electron EB2 detected by the detector 12 and the fluorescence FL detected by the camera 15 as electron information. Electron information transmitted from the signal processing unit C3 is converted into the image data in the image processing unit C6. The acquired image data can be checked on the display unit C8 via the CPU unit C5 and is recorded on the storage unit C7.

<Structure of Stage 20>

Hereinafter, a detailed structure and an operation of the stage 20 will be described with reference to FIGS. 2 and 3. FIG. 2 is a plan view illustrating the stage 20 and FIG. 3 is a sectional view illustrating the stage 20. In FIG. 3, to prioritize comprehensibility of the configuration, each actuator, each supporter, the sample holder 30, and the sample conveyance device 40 are illustrated on the same cross section.

In the first embodiment, the storage 20 includes a rough movement stage member 21*a*, an X rough movement actuator 22*a*, a Y rough movement actuator 23*a*, an X rough movement supporter 24*a*, a Y rough movement supporter 25*a*, an X position detection element 26, a Y position detection element 27, a fine movement stage member 21*b*, an X fine movement actuator 22*b*, a Y fine movement actuator 23*b*, an X fine movement supporter 24*b*, and a Y fine movement supporter 25*b*.

Planar shapes of the rough movement stage member 21*a* and the fine movement stage member 21*b* are annular. The rough movement stage member 21*a* and the fine movement stage member 21*b* are disposed to be concentric to each other. In other words, a center of an annulus of the rough movement stage member 21*a* and a center of an annulus of the fine movement stage member 21*b* substantially match the optic axis OA, respectively.

The "annulus" described in the present specification may be substantially the same as a mathematical annulus and does not have to be exactly the same as the mathematical annulus. For example, an annulus that has a notch in a part of an outer diameter or an inner diameter is also included in the "annulus" described in the present specification.

The X rough movement actuator 22*a*, the Y rough movement actuator 23*a*, the X rough movement supporter 24*a*, and the Y rough movement supporter 25*a* are connected to the rough movement stage member 21*a*. The X rough movement actuator 22*a* and the Y rough movement actuator 23*a* are connected to different positions of the rough movement stage member 21*a*, respectively. The X rough movement supporter 24*a* and the Y rough movement supporter 25*a* are connected to different positions of the rough movement stage member 21*a*, respectively.

An operation of each of the X rough movement actuator 22*a* and the Y rough movement actuator 23*a* is controlled by the stage control unit C2. The X rough movement actuator 22*a* and the Y rough movement actuator 23*a* are stretched and contracted to apply a force to the rough movement stage member 21*a*, so that the rough movement stage member 21*a* can be moved.

A direction of the force applied to the rough movement stage member 21*a* is parallel to each direction oriented from the X rough movement actuator 22*a* and the Y rough movement actuator 23*a* to the center of the annulus (the optic axis OA) of the rough movement stage member 21*a*. An angle formed by the direction of the force applied to the rough movement stage member 21*a* by the X rough movement actuator 22*a* and the direction of the force applied to the rough movement stage member 21*a* by the Y rough movement actuator 23*a* is 90 degrees ideally.

The rough movement stage member 21*a* is disposed to surround the fine movement stage member 21*b* in a plan view, and the X rough movement actuator 22*a* and the Y rough movement actuator 23*a* are connected to the barrel 2 and the rough movement stage member 21*a*.

Between the barrel 2 and the rough movement stage member 21*a*, the X rough movement supporter 24*a* and the Y rough movement supporter 25*a* are provided at positions point-symmetric with the X rough movement actuator 22*a* and the Y rough movement actuator 23*a* with respect to the center of the annulus of the rough movement stage member 21*a*. In other words, the X rough movement supporter 24*a* and the X rough movement actuator 22*a* are provided on the same line passing through the optic axis OA, and the Y rough movement supporter 25*a* and the Y rough movement actuator 23*a* are provided on the same line passing through the optic axis OA.

The X rough movement supporter 24*a* and the Y rough movement supporter 25*a* are stretched and contracted in accordance with the force applied to the rough movement stage member 21*a* by the X rough movement actuator 22*a* and the Y rough movement actuator 23*a*, respectively.

The X fine movement actuator 22*b*, the Y fine movement actuator 23*b*, the X fine movement supporter 24*b*, and the Y fine movement supporter 25*b* are connected to the fine movement stage member 21*b*. The X fine movement actuator 22*b* and the Y fine movement actuator 23*b* are connected to different positions of the fine movement stage member 21*b*, respectively. The X fine movement supporter 24*b* and the Y fine movement supporter 25*b* are connected to different positions of the fine movement stage member 21*b*, respectively.

An operation of each of the X fine movement actuator 22*b* and the Y fine movement actuator 23*b* is controlled by the stage control unit C2. The X fine movement actuator 22*b* and the Y fine movement actuator 23*b* are stretched and contracted to apply a force to the fine movement stage member 21*b*, so that the fine movement stage member 21*b* can be moved.

A direction of the force applied to the fine movement stage member 21*b* is parallel to each direction oriented from the X fine movement actuator 22*b* and the Y fine movement actuator 23*b* to the center of the annulus (the optic axis OA) of the fine movement stage member 21*b*. An angle formed by the direction of the force applied to the fine movement stage member 21*b* by the X fine movement actuator 22*b* and the direction of the force applied to the fine movement stage member 21*b* by the Y fine movement actuator 23*b* is 90 degrees ideally.

The X fine movement actuator 22*b* and the Y fine movement actuator 23*b* are connected to the fine movement stage member 21*b* and the rough movement stage member 21*a*. In the fine movement stage member 21*b*, the X position detection element 26 is provided at a position adjacent to the X fine movement actuator 22*b* and the Y position detection element 27 is provided at a position adjacent to the Y fine movement actuator 23*b*.

Between the fine movement stage member 21*b* and the rough movement stage member 21*a*, the X fine movement supporter 24*b* and the Y fine movement supporter 25*b* are provided at positions point-symmetric with the X fine movement actuator 22*b* and the Y fine movement actuator 23*b* with respect to the center of the annulus of the fine movement stage member 21*b*. In other words, the X fine movement supporter 24*b* and the X fine movement actuator 22*b* are provided on the same line passing through the optic axis OA, and the Y fine movement supporter 25*b* and the Y fine movement actuator 23*b* are provided on the same line passing through the optic axis OA.

The X fine movement supporter 24*b* and the Y fine movement supporter 25*b* are stretched and contracted in accordance with the force applied to the fine movement stage member 21*b* by the X fine movement actuator 22*b* and the Y fine movement actuator 23*b*, respectively.

When the sample SAM is analyzed, the sample holder 30 holding the sample SAM is installed in the fine movement stage member 21*b* so that the sample SAM is positioned on the optic axis OA. The sample SAM is irradiated with the electron beam EB1 emitted from the electron gun 3, and a region of the sample SAM irradiated with the electron beam EB1 is observed as the field of vision.

Since the rough movement stage member 21*a* and the fine movement stage member 21*b* are annular, the electron beam EB1 emitted to the sample SAM, the secondary electron EB2 generated from the sample SAM, and the transmission electron EB3 passing through the sample SAM are not obstructed by the stage 20.

Here, when the rough movement stage member 21*a* is moved by the X rough movement actuator 22*a* and the Y rough movement actuator 23*a*, the fine movement stage member 21*b* is also accordingly moved. The fine movement stage member 21*b* is moved by the X fine movement actuator 22*b* and the Y fine movement actuator 23*b*. Therefore, by moving the rough movement stage member 21*a* or the fine movement stage member 21*b*, it is possible to move a position of the field of vision of the sample SAM.

The X position detection element 26 and the Y position detection element 27 are provided to detect a position of the fine movement stage member 21*b*, and thus a position relative to the origin of the fine movement stage member 21*b* can be detected. Since a distance from a position of each of the X position detection element 26 and the Y position detection element 27 to the center of the annulus (the optic axis OA) of the fine movement stage member 21*b* is known in advance, the computer control unit C4 can calculate how much the position of the field of vision (an irradiation position of the electron beam EB1) of the sample SAM is moved as the fine movement stage member 21*b* is moved.

The position of each of the X position detection element 26 and the Y position detection element 27 may be a position adjacent to the X fine movement actuator 22*b* and the Y fine movement actuator 23*b* in a plan view, as illustrated in FIG. 2 or may be a position adjacent to the X fine movement actuator 22*b* and the Y fine movement actuator 23*b* in a cross-sectional view, as illustrated in FIG. 3. Also, in the rough movement stage member 21*a*, a position detection element that has a similar function may be provided. In this case, since the position of the fine movement stage member 21*b* and a position of the rough movement stage member 21*a* can be detected, the position of the field of vision (the irradiation position of the electron beam EB1) of the sample SAM can be detected directly from these results.

The X fine movement actuator 22*b* and the Y fine movement actuator 23*b* are used to move the field of vision of which a movement distance is relatively short, and have movable ranges narrower than those of the X rough movement actuator 22*a* and the Y rough movement actuator 23*a*. In other words, a first movable range in which the X rough movement actuator 22*a* and the Y rough movement actuator 23*a* can move the rough movement stage member 21*a* is broader than a second movable range in which the X fine movement actuator 22*b* and the Y fine movement actuator 23*b* can move the fine movement stage member 21*b*.

Since position resolution is low in movement of the field of vision by only the X rough movement actuator 22*a* and the Y rough movement actuator 23*a*, it is difficult to move the field of vision with high accuracy. However, for example, after the stage 20 is considerably moved to the vicinity of a subsequent field of vision by the X rough movement actuator 22*a* and the Y rough movement actuator 23*a*, the stage 20 can be moved to the subsequent field of vision with high position resolution by the X fine movement actuator 22*b* and the Y fine movement actuator 23*b*.

The X fine movement actuator 22*b* and the Y fine movement actuator 23*b* are configured by, for example, piezoelectric elements. The X rough movement actuator 22*a* and the Y rough movement actuator 23*a* are configured by, for example, motors.

These actuators can be configured as follows as substitutions. When the motors are also applied to the X fine movement actuator 22*b* and the Y fine movement actuator 23*b*, the movement resolution and a stroke may be adjusted by using levers with different leverages for such motors. When the piezoelectric elements are also applied to the X rough movement actuator 22*a* and the Y rough movement actuator 23*a*, types of actuators that send a rod using a plurality of piezoelectric elements are used for the X rough movement actuator 22*a* and the Y rough movement actuator 23*a*, and stretching and contracting of one piezoelectric element may be directly used for the X fine movement actuator 22*b* and the Y fine movement actuator 23*b*.

The X rough movement supporter 24*a*, the Y rough movement supporter 25*a*, the X fine movement supporter 24*b*, and the Y fine movement supporter 25*b* may be configured to be stretched and contracted or deformed in accordance with a stress from each corresponding actuator and are configured by, for example, a reaction spring, a plate spring, a solenoid, or a rubber.

The X position detection element 26 and the Y position detection element 27 are configured by, for example, an electrostatic capacitance sensor, a linear scale, a strain gauge, or a laser range finder.

Although not illustrated, in addition to the above-described configuration, the stage 20 includes a Z-axis driving mechanism that can be displaced in the same direction as the optic axis OA and is aimed to perform focus or adjustment of a work distance with the sample SAM, a T-axis driving mechanism that emits the electron beam EB1 at an angle with respect to the sample SAM, and a T-axis driving mechanism that rotates the sample SAM. Each of these driving mechanisms may include a fine movement actuator and a rough movement actuator.

As illustrated in FIG. 2, in the first embodiment, the X rough movement actuator 22*a* and the X fine movement actuator 22*b* are provided on the same line passing through the optic axis OA, and the Y rough movement actuator 23*a* and the Y fine movement actuator 23*b* are provided on the same line passing through the optic axis OA. However, it is not necessary to provide these actuators on the same lines. For example, the rough movement actuators and the fine movement actuators may be configured to be deviated by 45 degrees or 90 degrees. In this case, when the rough or fine movement actuator operates, the user does not perform an operation and the computer control unit C4 or the stage control unit C2 automatically performs coordinate conversion. Therefore, the field of vision is automatically moved to an observation position of the target sample SAM. The automatic movement of the field of vision of the sample SAM is not a direct purpose. However, the automatic coordinate conversion can facilitate movement of each stage member to a direction or coordinates designated by the user or the computer control unit C4 although there are a plurality of axial directions of each actuator.

In FIGS. 2 and 3, the case where the rough movement stage member 21*a* is disposed to surround the fine movement stage member 21*b* in a plan view is exemplified. However, the fine movement stage member 21*b* may be disposed to surround the rough movement stage member 21*a* in a plan view. That is, the positional relationship between the rough movement stage member 21*a* and the fine movement stage member 21*b* may be reversed. In this case, the positional relationships among each actuator, each supporter, and each position detector connected to the rough movement stage member 21*a* and the fine movement stage member 21*b* may be reversed.

Main Advantageous Effects Obtained from Stage 20

First, the stage 20 according to the first embodiment is used for the charged particle microscope 1 of the side entry system. Therefore, as exemplified as the first problem, the deterioration in the resolution due to enlargement of a bore diameter, the difficulty in handling various applications, the difficulty in handling image observation of secondary electrons and backscattered electrons, and the difficulty in handling element analysis using an X ray can be solved.

Next, the planar shapes of the rough movement stage member 21*a* and the fine movement stage member 21*b* are annular, and the rough movement stage member 21*a* and the fine movement stage member 21*b* are disposed to be concentric to each other. Therefore, a change in heat such as thermal expansion or thermal contraction easily occurs uniformly centering on the optic axis OA. Accordingly, the drift of the position of the field of vision as exemplified as the second problem can be suppressed.

The planar shapes of the rough movement stage member 21*a* and the fine movement stage member 21*b* may be circular rather than being annular. The planar shapes of these stage members may be preferably annular in consideration of the advantageous effect of uniformizing a change in heat, as described above.

The sample holder 30 is installed on the fine movement stage member 21*b* by the sample conveyance device 40. After the sample holder 30 is installed, the sample conveyance device 40 and the sample holder 30 are mechanically detached, the sample conveyance device 40 is conveyed to the outside of the charged particle microscope 1, and the sample holder 30 remains inside the barrel 2. Accordingly, since the sample holder 30 is physically separated from an external environment, image vibration and drift of the position of the field of vision can be suppressed even when a change in an atmospheric pressure occurs outside of the charged particle microscope 1, as exemplified as the second problem.

Next, as the third problem, there is a problem that narrowness of the maximum movement range of the field of vision occurs when the piezoelectric elements are used in the actuators (stage pressing members). As the fourth problem, there is a problem that shortage of the resolution for highly accurate movement of the field of vision occurs when the motor is used instead of the piezoelectric element.

The stage 20 according to the first embodiment includes the X rough movement actuator 22*a* and the Y rough movement actuator 23*a* and includes the X fine movement actuator 22*b* and the Y fine movement actuator 23*b* that have movable distances different from those of these rough movement actuators. Therefore, for example, the stage 20 is considerably moved to the vicinity of a subsequent field of vision by the X rough movement actuator 22*a* and the Y rough movement actuator 23*a*. Thereafter, the stage 20 can be moved to the subsequent field of vision with high resolution by the X fine movement actuator 22*b* and the Y fine movement actuator 23*b*. Accordingly, the above-described third and fourth problems can be solved. It is not necessary to use the image shift function such as the fifth problem.

As described above, according to the first embodiment, it is possible to improve performance of the charged particle microscope 1 and provide the stage for implementing the improvement in the performance.

<Field-of-Vision Movement Means Using Stage 20>

Hereinafter, a field-of-vision movement means according to the first embodiment will be described with reference to FIG. 4. FIG. 4 is a flowchart illustrating the field-of-vision movement means.

First, in step S1, a movement amount of the field of vision is input. For example, the user designates stage coordinates (the X and Y coordinates) which are an analysis target using a track ball or the like while checking a captured image of the sample SAM on the display unit C8, and the CPU unit C5 or a structure of the track ball divides the designated stage coordinates into X and Y components and sets the X and Y components as the movement amount of the field of vision. The CPU unit C5 may automatically calculate a movement amount of the field of vision from current stage coordinates to the designated stage coordinates.

In step S2, magnitude between the movement amount of the field of vision and the first movable range of the X fine movement actuator 22*b* and the Y fine movement actuator 23*b* is determined after step S1.

As described above, the first movable range in which the X fine movement actuator 22*b* and the Y fine movement actuator 23*b* can move the fine movement stage member 21*b* is broader than the second movable range in which the X rough movement actuator 22*a* and the Y rough movement actuator 23*a* can move the rough movement stage member 21*a*.

When the field of vision is moved, the stage control unit C2 of the general control unit C0 causes the X rough movement actuator 22*a* and the Y rough movement actuator 23*a* to move the rough movement stage member 21*a* in a case where the movement distance of the field of vision is greater than the second movable range (NO). A subsequent step is step S3.

On the other hand, the stage control unit C2 of the general control unit C0 causes the X fine movement actuator 22*b* and the Y fine movement actuator 23*b* to move the fine movement stage member 21*b* when the movement distance of the field of vision is less than the second movable range (YES). A subsequent step is step S5.

In step S3, work for returning the stage coordinates of the X fine movement actuator 22*b* and the Y fine movement actuator 23*b* to the origin position is performed after step S2. Here, the origin position is a middle point of the movable range or a position at which a largest possible stroke can be secured when the X fine movement actuator 22*b* and the Y fine movement actuator 23*b* are moved at the next time.

In step S4, the rough movement stage member 21*a* is moved by the X rough movement actuator 22*a* and the Y rough movement actuator 23*a* to move the field of vision after step S3.

In step S5, the fine movement stage member 21*b* is moved by the X fine movement actuator 22*b* and the Y fine movement actuator 23*b* to move the field of vision after step S2.

In step S6, it is determined whether the field of vision is moved to a subsequent field of vision after step S4 or S5. When the field of vision is moved to the subsequent field of vision (YES), a subsequent step is step S1. Thereafter, steps S1 to S6 are repeated. When the field of vision is not moved to the subsequent field of vision (NO), the analysis work for the sample SAM ends.

For example, when the rough movement stage member 21*a* is moved in step S4 and a desired captured image can be acquired at that position, the observation may be ended. When the fine movement stage member 21*b* is moved in step S5 and a desired captured image can be acquired at that position, the observation may be ended. The rough movement stage member 21*a* can be moved in step S4, steps S1 and S2 can be subsequently performed, and then the fine movement stage member 21*b* can be moved in step S5 to acquire a captured image at that position.

In this way, by comparing the movement amount of the field of vision with the first movable range of the X fine movement actuator 22*b* and the Y fine movement actuator 23*b*, it is possible to appropriately select movement by the rough movement stage member 21*a* or movement by the fine movement stage member 21*b*. Accordingly, it is possible to achieve both the maximum movement range of the field of vision and the high resolution.

The user may not determine which member is moved between the fine movement stage member 21*b* and the rough movement stage member 21*a*, and the computer control unit C4 can automatically select an appropriate actuator.

Hereinafter, a first field-of-vision movement means and a second field-of-vision movement means included in the general control unit C0 will be described as a specific means using a captured image, a mesh, and the like with reference to FIGS. 5 to 7.

<First Field-of-Vision Movement Means>

FIG. 5 illustrates a captured image 50 in which a mesh 31 mounted on the sample holder 30 and the plurality of samples SAM located on the mesh 31 are shown. FIG. 5 also illustrates a captured image of an inner structure 53 observed when a magnification of the charged particle microscope 1 is raised.

As illustrated in FIG. 5, the plurality of samples SAM are located on addresses allocated to the mesh 31. The addresses are configured in combination of row addresses 51 such as "A, B, C, . . . " and column addresses 52 such as "1, 2, 3, . . . ". The plurality of samples SAM are distributed to addresses such as "A-1", "A-2", . . . "H-7" and information regarding these addresses corresponds to stage coordinates. Here, after the field of vision from "A-1" to "A-7" is moved, a field of vision to be subsequently moved is "B-1".

In the first field-of-vision movement means, a step of causing the general control unit C0 to retain the information regarding the addresses is first performed. Subsequently, the general control unit C0 performs a step of determining the magnitude between the movement distance of the field of vision and the first movable range of the fine movement actuator based on the information regarding these addresses.

When the movement distance of the field of vision is greater than the first movable range of the fine movement actuator, the rough movement stage member 21*a* is moved by the X rough movement actuator 22*a* and the Y rough movement actuator 23*a*. For example, when the field of vision is moved from the sample SAM of "A-1" to the sample SAM of "A-2", that is, when the field of vision is moved between the plurality of samples SAM or the movement distance of the field of vision exceeds the first movable range of the fine movement stage member 21*b* in the same sample SAM, the rough movement stage member 21*a* is moved.

When the movement distance of the field of vision is less than the first movable range of the fine movement actuator, the fine movement stage member 21*b* is moved by the X fine movement actuator 22*b* and the Y fine movement actuator 23*b*. For example, when a microstructure such as the inner structure 53 is imaged as a plurality of still captured images and the still captured images are connected through image processing or the like or the field of vision is further moved minutely from a current site, the fine movement stage member 21*b* is moved.

In this way, by moving the rough movement stage member 21*a* or the fine movement stage member 21*b* by the first field-of-vision movement means, it is possible to observe and image the microstructure such as the inner structure 53.

<Second Field-of-Vision Movement Means>

FIGS. 6 and 7 illustrate a mark-attached mesh 32 mounted on the sample holder 30 and a first captured image 54 and a second captured image 55 indicating the plurality of samples SAM located on the mark-attached mesh 32 with a mark 33. The second captured image 55 in FIG. 7 is captured by enlarging the periphery of the mark 33. In FIGS. 6 and 7, a captured image of the inner structure 53 observed when the magnification of the charged particle microscope 1 is raised is also illustrated. The mark 33 is preferably formed in the vicinity of the middle portion of the mark-attached mesh 32.

In the first field-of-vision movement means of FIG. 5, the row addresses 51 and the column addresses 52 are allocated in advance on the mesh 31, but the samples SAM cannot be said to be constantly placed on these addresses. When the mesh 31 is mounted on the sample holder 30 in a state where the mesh 31 itself is rotated, it is difficult to manage the stage coordinates of the plurality of samples SAM in accordance with these addresses. In particular, in a charged particle microscope with high resolution, it is difficult to acquire a captured image (an electron beam image) of the entire mesh 31.

Accordingly, in the second field-of-vision movement means, a step of causing the general control unit C0 (the storage unit C7) to retain a first captured image 54 which is captured in advance and indicates the entire mark-attached mesh 32 on which the plurality of samples SAM are located is first performed. The first captured image 54 is, for example, an optical image captured by an optical camera or the like or a captured image (an electron beam image) obtained with a charged particle microscope corresponding to low magnification.

Subsequently, by performing vacuum exhaust of the inside of the barrel 2 and then causing the general control unit C0 to operate the charged particle microscope 1 including the electron gun 3 and the stage 20, a step of causing the general control unit C0 (the storage unit C7) to acquire a second captured image 55 which is a part of the mark-attached mesh 32 on which the plurality of samples SAM are located and which indicates the periphery of the mark 33 is performed. The second captured image 55 is, for example, a captured image (an electron beam image) captured at low magnification.

Subsequently, the general control unit C0 performs a step of comparing the position of the mark 33 of the first captured image 54 with the position of the mark 33 of the second captured image 55. By comparing the shapes of the marks 33, it is possible to determine how much the mark-attached mesh 32 is rotated, for example, in a state where the mark-attached mesh 32 is rotated.

Subsequently, the general control unit C0 performs a step of calculating stage coordinates of each of the plurality of samples SAM using the compared positions of the mark 33 as a reference. The stage coordinates are recorded on the storage unit C7 of the general control unit C0.

Subsequently, the general control unit C0 performs a step of determining magnitude between the movement distance of the field of vision and the first movable range of the fine movement stage member 21*b* based on the stage coordinates.

The movement of the field of vision (the movement of the stage 20) when the movement distance of the field of vision is greater than the first movable range of the fine movement stage member 21*b* and when the movement distance of the field of vision is less than the first movable range of the fine movement stage member 21*b* is similar to that of the first field-of-vision movement means.

In this way, the second field-of-vision movement means can also observe and image a microstructure such as the inner structure 53 by moving the rough movement stage member 21*a* or the fine movement stage member 21*b*.

The present invention has been described specifically according to the foregoing embodiments, but the present invention is not limited to the foregoing embodiments and can be modified in various forms within the scope of the present invention without departing from the gist of the present invention.

For example, in the foregoing embodiments, the case where the charged particle microscope 1 including the stage 20 is a transmission electron microscope (TEM) has been described. However, the charged particle microscope 1 may be a scanning electron microscope (SEM), a scanning transmission electron microscope (STEM), a combined device (FIB-SEM) of a scanning ion microscope and a scanning electron microscope or an applied device thereof and may be a device capable of processing, analyzing, and inspecting a sample.

REFERENCE SIGNS LIST

1: charged particle microscope
2: barrel
3: electron gun
4: electron source
5: suppression electrode
6: extraction electrode
7: positive pole
8: electron optical system
9: condensing lens
10: deflection lens
11*a*: top pole piece (top object lens)
11*b*: bottom pole piece (bottom object lens)
12: detector
13: imaging system
14: fluorescent plate
15: camera
20: stage
21*a*: rough movement stage member
21*b*: Fine movement stage member
22*a*: X rough movement actuator
22*b*: X fine movement actuator
23*a*: Y rough movement actuator
23*b*: Y fine movement actuator
24*a*: X rough movement supporter
24*b*: X fine movement supporter
25*a*: Y rough movement supporter
25*b*: Y fine movement supporter
26: X position detection element
27: Y position detection element
30: sample holder
31: mesh
32: mark-attached mesh
33: mark
40: sample conveyance device
41: flange
50: captured image
51: row address
52: column address
53: inner structure
54: first captured image
55: second captured image
C0: general control unit (control unit)
C1: main control unit
C2: stage control unit
C3: signal processing unit
C4: computer control unit
C5: CPU unit
C6: image processing unit
C7: storage unit
C8: display unit
EB1: electron beam
EB2: signal electron
EB3: transmission electron
FL: fluorescence
SAM: sample

The invention claimed is:

1. A charged particle microscope comprising:
a barrel;
an electron gun provided inside the barrel and capable of emitting an electron beam; and
a stage provided below the electron gun inside the barrel, fixed to the barrel, and configured to install a sample holder with a sample held, wherein
the stage includes
a first stage member of which a planar shape is annular,
a second stage member disposed to be concentric to the first stage member,
a first actuator connected to the first stage member, and
a second actuator connected to the second stage member, wherein
a first movable range in which the first actuator is able to move the first stage member is broader than a second movable range in which the second actuator is able to move the second stage member.

2. The charged particle microscope according to claim 1, wherein
a direction of a force applied to the first stage member by the first actuator is parallel to a direction oriented from the first actuator to a center of the annulus of the first stage member, and
a direction of a force applied to the second stage member by the second actuator is parallel to a direction oriented from the second actuator to a center of the second stage member.

3. The charged particle microscope according to claim 2, wherein
the two first actuators are connected to different positions of the first stage member,
an angle formed between a direction of a force applied to the first stage member by one of the first actuators and a direction of a force applied to the first stage member by the other first actuator is 90 degrees,
the two second actuators are connected to different positions of the second stage member, and
an angle formed between a direction of a force applied to the second stage member by one of the second actuators and a direction of a force applied to the second stage member by the other second actuator is 90 degrees.

4. The charged particle microscope according to claim 3, wherein
the first stage member is disposed to surround the second stage member in a plan view,
the two second actuators are respectively connected to the first and second stage members, and
the two first actuators are respectively connected to the barrel and the first stage member.

5. The charged particle microscope according to claim 4, wherein
between the first and second stage members, two second supporters stretched and contracted in accordance with a force applied to the second stage member respectively by the two second actuators are provided at positions point-symmetric with the two second actuators with respect to a center of the annulus of the second stage member, and
between the barrel and the first stage member, two first supporters stretched and contracted in accordance with a force applied to the first stage member respectively by the two first actuators are provided at positions point-symmetric with the two first actuators with respect to a center of the annulus of the first stage member.

6. The charged particle microscope according to claim 1, wherein a position detection element detecting a position of the second stage member is connected to the second stage member.

7. The charged particle microscope according to claim 1, wherein the second actuator is configured by a piezoelectric element.

8. The charged particle microscope according to claim 1, wherein, when the sample is analyzed, the sample holder holding the sample is installed in the second stage member, the sample is irradiated with the electron beam emitted from the electron gun, and a region of the sample irradiated with the electron beam is observed as a field of vision.

9. The charged particle microscope according to claim 8, further comprising:

a control unit electrically connected to the electron gun and the stage and capable of controlling operations of the electron gun and the stage, wherein when the field of vision is moved, the control unit causes the first actuators to move the first stage member in a case where a movement distance of the field of vision is greater than the second movable range, and causes the second actuators to move the second stage member in a case where the movement distance of the field of vision is less than the second movable range.

10. The charged particle microscope according to claim 9, wherein a mesh is mounted on the sample holder, a plurality of samples are located on the mesh, and the plurality of samples are located on addresses allocated to the mesh, and wherein the control unit includes a first field-of-vision movement means, wherein the first field-of-vision movement means includes (a) a step of causing the control unit to retain information regarding the addresses, and (b) a step of causing the control unit to determine magnitude between the movement distance of the field of vision and the first movable range based on the information regarding the addresses.

11. The charged particle microscope according to claim 9, wherein a mesh with a mark is mounted on the sample holder, and a plurality of the samples are located on the mesh, and wherein the control unit includes a second field-of-vision movement means, wherein the second field-of-vision movement means includes (a) a step of causing the control unit to retain a first captured image indicating the entire mesh which is imaged in advance and on which the plurality of samples are located, (b) a step of causing the control unit to operate the electron gun and the stage and causing the control unit to acquire a second captured image which is a part of the mesh on which the plurality of samples are located and which indicates a periphery of the mark, (c) a step of causing the control unit to compare a position of the mark in the first captured image and a position of the mark in the second captured image, (d) a step of causing the control unit to calculate stage coordinates of each of the plurality of samples using the compared positions of the mark, and (e) a step of causing the control unit to determine magnitude between the movement distance of the field of vision and the first movable range based on the stage coordinates.

12. A stage for a charged particle microscope, the stage comprising:

a first stage member of which a planar shape is annular;

a second stage member disposed to be concentric to the first stage member;

a first actuator connected to the first stage member; and a second actuator connected to the second stage member, wherein a first movable range in which the first actuator is able to move the first stage member is broader than a second movable range in which the second actuator is able to move the second stage member.

13. The stage according to claim 12, wherein a direction of a force applied to the first stage member by the first actuator is parallel to a direction oriented from the first actuator to a center of the annulus of the first stage member, and a direction of a force applied to the second stage member by the second actuator is parallel to a direction oriented from the second actuator to a center of the second stage member.

14. The stage according to claim 13, wherein the two first actuators are connected to different positions of the first stage member, an angle formed between a direction of a force applied to the first stage member by one of the first actuators and a direction of a force applied to the first stage member by the other first actuator is 90 degrees, the two second actuators are connected to different positions of the second stage member, and an angle formed between a direction of a force applied to the second stage member by one of the second actuators and a direction of a force applied to the second stage member by the other second actuator is 90 degrees.

15. The stage according to claim 12, wherein the second actuator is configured by a piezoelectric element.

* * * * *